(12) United States Patent
Yeo et al.

(10) Patent No.: US 10,003,911 B2
(45) Date of Patent: *Jun. 19, 2018

(54) ELECTRONIC DEVICE WITH A CURVED DEPRESSION FOR ENGAGING WITH A PROTRUSION OF ANOTHER ELECTRONIC DEVICE TO PROVIDE DATA TRANSFER THEREBETWEEN

(71) Applicant: SONY CORPORATION, Tokyo (JP)

(72) Inventors: Ching Biing Yeo, Singapore (SG); Yu Gang Ma, Singapore (SG)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 64 days.

This patent is subject to a terminal disclaimer.

(21) Appl. No.: 15/005,015

(22) Filed: Jan. 25, 2016

(65) Prior Publication Data

US 2016/0142869 A1    May 19, 2016

Related U.S. Application Data

(63) Continuation of application No. 13/897,128, filed on May 17, 2013, now Pat. No. 9,246,551.

(30) Foreign Application Priority Data

May 24, 2012    (SG) .................................. 201203884-0

(51) Int. Cl.
  *H04B 5/00*    (2006.01)
  *H04W 4/00*    (2018.01)
  *H03H 7/00*    (2006.01)

(52) U.S. Cl.
  CPC .............. *H04W 4/008* (2013.01); *H03H 7/00* (2013.01); *H04B 5/0031* (2013.01); *H04W 4/80* (2018.02); *H04W 76/14* (2018.02)

(58) Field of Classification Search
  CPC ...... H04B 5/0031; H04B 5/0012; H04B 5/00; H01P 5/0075
  USPC .............................. 333/24 R, 24 C; 455/41.1
  See application file for complete search history.

(56) References Cited

U.S. PATENT DOCUMENTS 9,246,551 B2 *    1/2016    Yeo et al. ................ H03H 7/00
2010/0081377 A1    4/2010    Chatterjee et al.

FOREIGN PATENT DOCUMENTS

JP        2008-277253 A    11/2008

* cited by examiner

*Primary Examiner* — Benny Lee
(74) *Attorney, Agent, or Firm* — Chip Law Group

(57) ABSTRACT

A data processing system is proposed which comprises two electronic devices, each of them having an electro-magnetic coupler embedded on the exterior casing, at least one of the electronic device having one or more sliding surfaces for directing relative movement between the two devices, such that they automatically come into correct alignment during the sliding.

8 Claims, 2 Drawing Sheets

ELECTRONIC DEVICE WITH A CURVED DEPRESSION FOR ENGAGING WITH A PROTRUSION OF ANOTHER ELECTRONIC DEVICE TO PROVIDE DATA TRANSFER THEREBETWEEN

The present application is a continuation application of U.S. patent application Ser. No. 13/897,128 filed on May 17, 2013, now U.S. Pat. No. 9,246,551, issued Jan. 26, 2016, which claims priority to Singapore patent application No. 201203884-0 filed on May 24, 2012 in the Intellectual Property Office of Singapore, the entire content of which is hereby incorporated by reference.

TECHNICAL FIELD

The invention relates to a data processing system which comprises at least two electronic devices, and in particular relates to how the devices are connected to each other for data transfer between them. One or both of the electronic devices may be, but are not limited to, mobile devices such as cameras and smart-phones and corresponding devices such as display instruments, storage drives and any other devices for processing data.

BACKGROUND OF THE INVENTION

There are many situations requiring data exchange between devices via efficient and reliable channels. Conventional means of connecting multiple devices include using cable or connectors (such as a USB connection), through which data are communicated. However, wired links are not compatible with the ever-increasing need for a more convenient and readily establishable connection between two devices. This is because it is always necessary to manually align and connect the connector(s) to the port of the device(s). Wear of the connectors and connection ports is also a problem.

Besides wired connections, wireless protocol such as Bluetooth and infrared protocols are also available for data communication between two devices. Wireless connection channels bring the benefit of simple connecting procedures since two devices can conveniently communicate with each other remotely without any physical connection in between. Thus, no manual alignment of the connector and port is necessary, and data is communicated through the electro-magnetic (EM) waves travelling freely through space. On the other hand, since wireless communication has less transmission directivity. Energy loss and low transmission efficiency are a problem for wireless communication over a long distance. More importantly, there have been increasing concerns about the harmful side effects of such EM emission on the human body.

It is desirable to provide a convenient, wear resistant and hassle-free communication channel between electronics devices, eliminating connecting wires and their connectors while minimizing EM emission losses. Close contact data communication had been explored in recent years. In this case, two electronic devices are brought in contact with each other at an intended location to allow the EM couplers located on the exterior casing of each device to be aligned thereby establishing surface connection for data communication. However, this usually requires some form of manual alignment between the two devices/couplers. Conventionally, the alignment is achieved either through mechanical guides or slotted plugs.

Therefore, it would be desirable to have a coupling technique such that when a user casually leaves a mobile device such as a camera or a smart-phone on a corresponding device such as a display instrument or a storage drive, two couplers of the respective devices become automatically aligned, without the user consciously aligning the devices accurately. As such, robust data communication could be achieved through the surface contact.

SUMMARY OF THE INVENTION

In general terms, the invention proposes a data processing system comprising two electronic devices, each of them having an electro-magnetic coupler embedded on the exterior casing, at least one of the electronic device having one or more sliding surfaces for directing relative movement between the two devices, such the two electronic devices automatically come into correct alignment during the sliding. The casings of the devices may be made of plastic.

Specifically, there is provided a data processing system comprising: a first electronic device having one or more data processors, a first casing enclosing the one or more data processors and a first data transfer electro-magnetic coupler located on the first casing, and a second electronic device having one or more data processors, a second casing enclosing the one or more data processors and a second data transfer electro-magnetic coupler located on the second casing, at least one of the first and second electronic device comprising a plurality of sliding surfaces for directing relative movement between the first and second electronic devices, at least two of the sliding surfaces being mutually inclined, wherein upon the first and second electronic devices being urged together by a force in a direction inclined to at least one the sliding surface, one of the electronic devices slides along the at least one the sliding surface to bring the data transfer electro-magnetic couplers into alignment, whereby the first electronic device is automatically positioned with respect to the second electronic device and with the couplers in alignment, and surface connection is established between the couplers at the point of alignment to enable high speed data communication between the two electronic devices.

The term "inclined" is given its conventional meaning of "neither parallel to, nor orthogonal to". The force being in a direction inclined to a surface means that the force is in a direction which has an angle greater than 0 and less than 90° relative to the normal direction of the surface. Preferably, the angle is in a range from 10° to 80°, or 20° to 70°. Two sliding surfaces being mutually inclined means the normal directions of the two surfaces are neither parallel to, nor orthogonal to each other. A generally non-flat or curved surface is considered to comprise an infinite number of mutually inclined surfaces.

Typically, the force is the gravitational force that the one of the electronic devices is subject to.

Unlike a mechanical guide, which defines an unambiguous path along which the two devices may approach each other, a sliding surface defines a range of options of such paths. For example, the two devices may be casually brought into contact with each other at any point along the sliding surface, and the sliding surface will direct relative movement between the two devices and allow one of them to slide along the other and stop at an intended location automatically without manual intervention. Advantageously, the couplers located on the casing of two devices can be brought aligned face to face naturally and automatically under the influence of the weight of the device, without requiring external loads, supplementary alignment supports or clamping tools. Such surface connection facilitates EM waves to travel between them, while maximizing transmission directivity and minimizing radiation leakage.

Typically, each of the first and second electronic devices further comprises one or more magnets for generating a component of the force. Typically, the magnets are configured such that the electro-magnetic signals between the couplers are shielded from magnetic interference.

Advantageously, the magnetic attraction between the two devices effectively helps bring the electronic devices to full contact at an intended location without using external instrument or mechanical guides. The attraction further enhances stability of the surface connection between the two couplers.

The sliding surface is typically inclined to the overall profile of the casing on which it is provided. For example, many casing have a generally cuboidal profile (convex hull), and the normal direction to at least one sliding surface is inclined to each face of the cuboid.

In one embodiment, the first electronic device has a planar surface and the second electronic device comprises a depression having a sloping side wall and a bottom surface, the side wall and the bottom surface being the sliding surfaces, the depression having a shape configured to receive the first electronic device. In another embodiment, the second electronic device comprises a face and one or more projections projecting therefrom, the face and the surface of the one or more projections being the sliding surfaces, the sliding surfaces being arranged to stop relative movement of the two electronic devices at a position where the two couplers are in alignment when the face is upright. Typically, there are a plurality of the projections, the plurality of elements being arranged in a pattern suitable for the first electronic device to rest thereon when the face is upright and the couplers are in alignment. Typically, the projections have a frustum shape. Typically, the cross-sectional area of said projections reduces towards the face.

The term "upright" is given a conventional meaning as being "generally vertical". A face being upright generally means the normal of the face has an angle in the range of 0-20°, or more preferably 0-10° with respect to the horizontal.

In still another embodiment, the first electronic device comprises a protrusion having a curved surface and the second electronic device comprises a depression having a shape configured to receive the protrusion of the first electronic device. Typically, the first electronic device comprises a protrusion having a hemispherical shape. Typically, the depression has a smooth concave shape. In still another embodiment, the first electronic device comprises a protrusion having a frustum shape and the second electronic device comprises a depression having a shape being configured to receive the protrusion of the first electronic device. Typically, the depression has a frustum shape.

In any of the above embodiments the two couplers may be flat. At least one sliding surface is typically inclined to the plane of the couplers.

In any of the above embodiments one of the electronic devices may be a portable/mobile electronic device while the other may be non-portable/fixed electronic device. Alternatively, both devices may be mobile devices. Furthermore, the invention is applicable to situations with additional electronic devices, i.e. three or more devices in total, e.g. a large fixed electronic device receiving two mobile electronic devices. The electronic devices may be electronic devices which are made and sold separately, e.g. by different manufacturers. Thus, from another point of view, the invention may be defined as a single electronic device, arranged for connection to a second, and separately provided, electronic device.

BRIEF DESCRIPTION OF THE DRAWINGS

It will be convenient to further describe the present invention with respect to the accompanying drawings that illustrate embodiments of the invention. Other embodiments of the invention are possible, and consequently the particularity of the accompanying drawings is not to be understood as superseding the generality of the preceding description of the invention.

FIG. 3 (b) is a schematic view shows the cross-section of the data processing system that is a modified embodiment based on the third embodiment.

DETAILED DESCRIPTION OF THE INVENTION

Figure 1:
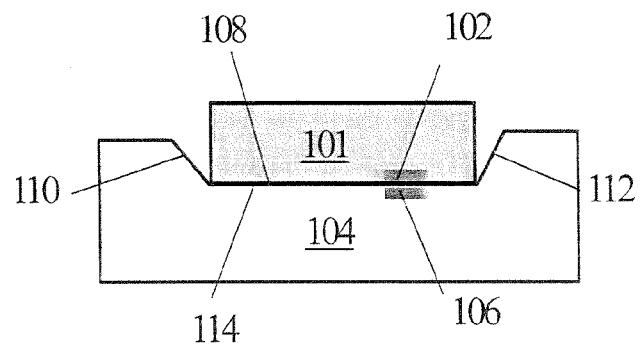
FIG. 1 is a schematic view shows the cross-section of the data processing system according to one embodiment of the invention.

FIG. 1 shows a data processing system 100 comprising a first data processing device 101 having a first electro-magnetic coupler 102 located on the exterior casing of the first device 101, and a second data processing device 104 having a second electro-magnetic coupler 106 located on the exterior casing of the second device 104. The casing of the first device 101 has a planar surface 108 on which the coupler 102 is located and the casing of the second device 104 has a depression. As shown in FIG. 1, the depression has sloping side walls 110, 112 and a planar bottom surface 114 to receive the first device 101. The side walls 110, 112 are inclined to the bottom surface 114. Therefore, when a user casually leaves the first electronic device 102 on any part of the depression of the second device 104, the first device 101 will slide along one of the sloping side walls 110, 112 and the bottom surface 114 due to gravity and sink to the bottom surface 114. Thus, the two couplers 102, 106 of the two devices 101, 104 are brought into face-to-face alignment whereby high speed data communication is established at their touching surface. In this embodiment, the sloping side walls 110, 112 and the bottom surface 114 are the sliding surfaces and the side walls 110, 112 are also inclined to the direction of the gravitational force. Preferably, the first device 101 is more compact and lighter than the second device 104. Preferably, the shape and size of the bottom surface 114 matches that of the surface 108 of the first device 101. Note that, at least two of the sliding surfaces 110, 112, 114 are mutually inclined.

Figure 2:
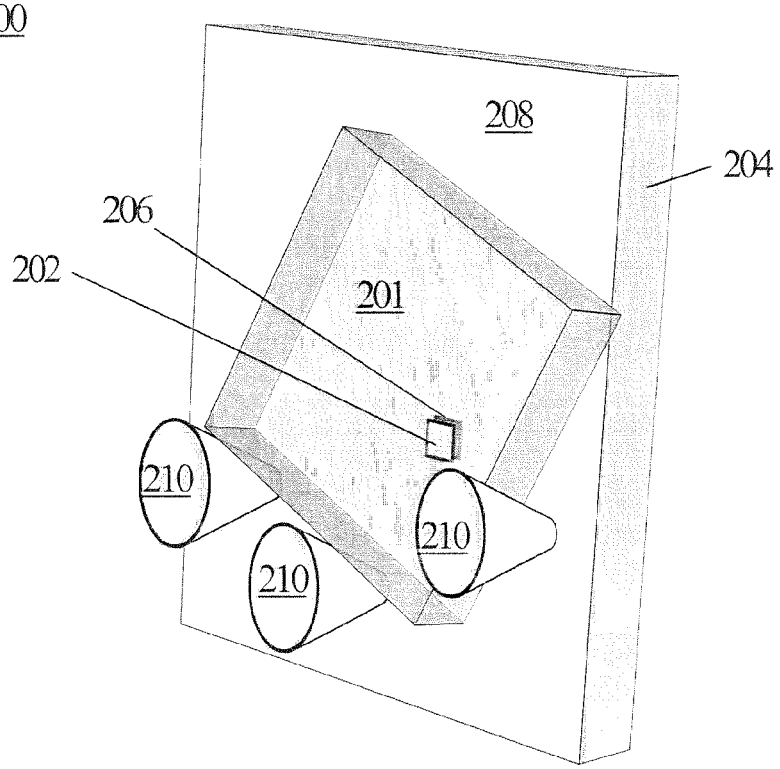
FIG. 2 is a schematic view of the data processing system according to another embodiment of the invention.

FIG. 2 shows another embodiment of the invention in which the contact surface of two devices is upright. A data processing system 200 comprises a first data processing device 201 having a first electro-magnetic coupler 202 located on the exterior casing the first device 201, and a second data processing device 204 having a second electro-magnetic coupler 206 located on the exterior casing the second device 204. The casing of the second device 204 has a generally upright face 208 on which the coupler 206 is located, and one or more projections 210 projecting from the face 208. As shown in FIG. 2, when there are a plurality of projection, the projections 210 are arranged in a pattern suitable for the first device to rest thereon when the face 208 is upright and couplers 202, 206 are in alignment. The upper surfaces of the projections are inclined upwards from the horizontal direction. When a user places the first device 201 on the projections 210, the first device 201 will slide downwards along the upper surfaces of the projections 210 due to gravity and eventually stop at an intended location on the face 208. Alternatively, when a user places the first device 201 on the face 208, the first device 201 will first slide downwards along the face 208 and then be directed to stop at the intended location after sliding along the surfaces of projections 210. As such, the two couplers 202, 206 of the two devices are brought into alignment whereby high speed data communication is established at their touching surface. In this embodiment, the upper surfaces of the projections 210 and the face 208 are the sliding surfaces. Note that at least the upper surfaces of the projections 210 are inclined to the direction of gravitational force. Also, at least two of the sliding surfaces are mutually inclined.

It should be noted that the multiple projections 210 as shown in FIG. 2 are an exemplary illustration of the possibility of having more than one projection. It is also possible that the face 208 only has a single projection provided it is arranged to direct and stop relative movement of the two electronic devices at the intended location described above.

Preferably, the first device 201 is more compact and lighter than the second device 204. The projections 210 may have a frustum shape whose cross-sectional area may reduce towards the face 208. Therefore, the upper surface of the projections 210 collectively form a slope that allows the first device 201 to slide towards the face 208 of the second device 204 and collectively support the first device 201 thereon.

Figure 3:
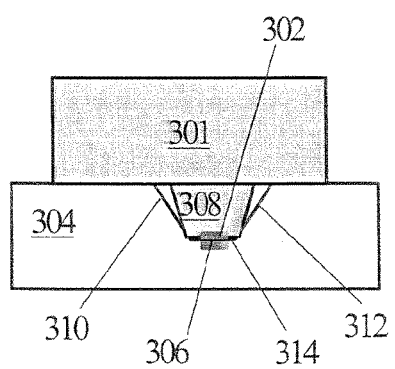
FIG. 3 (a) is a schematic view shows the cross-section of the data processing system according to a third embodiment of the invention.
Figure 3:
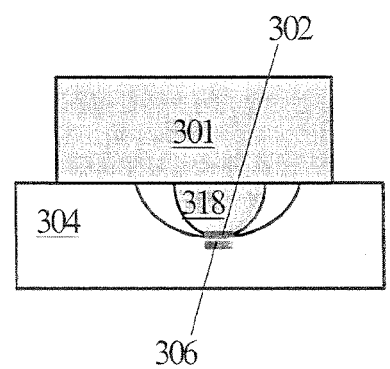

FIG. 3(*a*) shows the third embodiment of the invention. It comprises a first data processing device 301 having a first electro-magnetic coupler 302 located on the exterior casing the first device 301 and a second data processing device 304 having a second electro-magnetic coupler 306 located on the exterior casing the second device 304. The casing of the first device 301 comprises a protrusion 308 having a frustum shape and the casing of the second device 304 comprises a depression having a shape to receive the protrusion 308 of the first device 301. The depression may have a frustum shape with sloping side walls 310, 312 being inclined to a bottom surface 314. When a user places the protrusion 308 of the first device 301 onto any part of the depression of the second device 304, the first device 301 will slide along one of the sloping side walls 310, 312 and the bottom surface 314 due to gravity and sink to the bottom surface of the depression. In this embodiment, the side walls 310, 312 and the bottom surface 314 are the sliding surfaces. As such, the two couplers 302, 306 of the two devices are brought into alignment whereby high speed data communication may be established at their touching surface. Advantageously, the weight of the first device 301 presses both couplers firmly due to their small surface contact area (in contrast to the first embodiment in which the weight of the first device 101 is distributed over the whole face 108). At least two of the sliding surfaces 310, 312, 314 are mutually inclined.

FIG. 3(*b*) shows a slightly modified embodiment from that of FIG. 3(*a*). In this embodiment, the casing of the first electronic device 301 comprises a protrusion 318 having a curved surface which is generally flat at the bottom, and the casing of the second device 304 comprises a depression having a shape to receive the protrusion 318.

The protrusion 318 may have a hemispherical shape with a generally flat bottom surface and the depression may have a smooth concave shape with a generally flat bottom surface. The diameter of the concave depression may be larger than that of the hemispherical protrusion 318 except at the bottom surface. Advantageously, this allows the protrusion 318 to slide along the side walls of the depression more gently and smoothly compared to the embodiment with a frustum-shaped protrusion 308 (as shown in FIG. 3(*a*)). In this embodiment, the surface profile of the depression is generally curved and is thus considered to comprise an infinite number of mutually inclined sliding surfaces.

Optionally, the depth of the depression matches the height of the protrusion 318. Optionally, depending on the size of the couplers 302, 306, the flat bottom surface of the protrusion 318 and the depression can be adjusted such that each of the couplers 302, 306 fits horizontally in the center of the bottom surfaces, respectively.

In any of the above embodiments, each of the first and second devices may comprise one or more small magnets thereby providing magnetic attraction to further drive relative movement between the two devices and enhance the stability of the alignment of the two couplers. Preferably, the magnets are configured such that the electro-magnetic signals communicated between the couplers are shielded from magnetic interference due to the magnets. This may be achieved by using any common methods of restricting/redirecting magnetic field.

For example, at least one metal plate (yoke) can be provided (e.g. attached to the magnet) to confine the magnetic flux such that electronic circuits within the first and/or second devices can be protected from undesired disruption. The yoke(s) may be between the magnet and the electronic circuits. The yoke may be a thin metal plate. In any of the above embodiments, the two couplers may be flat.

When the first device is automatically positioned with respect to the second device and with the couplers in alignment, surface connection is established between the couplers at the point of alignment to enable robust data communication between the two devices. Both couplers stay in full contact throughout the data communication operation.

The embodiments have been described by way of example only and it will be appreciated that various modifications in detail may be made to the described embodiments above without departing from the spirit and scope of the claims.

The invention claimed is:

1. A first electronic device configured to connect to a second electronic device, said first electronic device comprising:
   a casing that comprises a depression that has a curved side wall and a flat bottom surface;
   one or more data processors enclosed by said casing; and
   a first data transfer electro-magnetic coupler fixed at said flat bottom surface of said depression,
   wherein upon said first electronic device and said second electronic device being urged together by a force, a protrusion in said second electronic device slides along said curved side wall to bring said first data transfer electro-magnetic coupler into alignment with a second data transfer electro-magnetic coupler of said second electronic device.

2. The first electronic device according to claim 1, wherein said curved side wall directs relative movement between said first electronic device and said second electronic device.

3. The first electronic device according to claim 1, wherein a surface connection is established between said first data transfer electro-magnetic coupler and said second data transfer electro-magnetic coupler to enable data communication between said first electronic device and said second electronic device.

4. The first electronic device according to claim 1, wherein said force is gravitational force.

5. The first electronic device according to claim 1, wherein said depression being configured to carry the protrusion on said second electronic device.

6. The first electronic device according to claim 1, wherein said first data transfer electro-magnetic coupler is fixed at a center of said flat bottom surface of said depression.

7. A first electronic device configured to connect to a second electronic device, said first electronic device comprising:
    a casing that comprises a protrusion that has a curved surface and a flat bottom surface;
    one or more data processors enclosed by said casing; and
    a first data transfer electro-magnetic coupler fixed at said flat bottom surface of said protrusion,
    wherein upon said first electronic device and said second electronic device being urged together by a force, said protrusion slides along a curved side wall of a depression in said second electronic device to bring said first data transfer electro-magnetic coupler into alignment with a second data transfer electro-magnetic coupler of said second electronic device.

8. The first electronic device according to claim 7, wherein said first data transfer electro-magnetic coupler is fixed at a center of said flat bottom surface of said protrusion.

* * * * *